(12) United States Patent
Zhu

(10) Patent No.: US 12,250,831 B2
(45) Date of Patent: Mar. 11, 2025

(54) SEMICONDUCTOR DEVICE AND METHOD OF MANUFACTURING THE SAME, AND ELECTRONIC APPARATUS INCLUDING SEMICONDUCTOR DEVICE

(71) Applicants: Beijing Superstring Academy of Memory Technology, Beijing (CN); Institute of Microelectronics, Chinese Academy of Sciences, Beijing (CN)

(72) Inventor: Huilong Zhu, Poughkeepsie, NY (US)

(73) Assignees: Beijing Superstring Academy of Memory Technology, Beijing (CN); Institute of Microelectronics, Chinese Academy of Sciences, Beijing (CN)

( * ) Notice: Subject to any disclaimer, the term of this patent is extended or adjusted under 35 U.S.C. 154(b) by 422 days.

(21) Appl. No.: 17/805,575

(22) Filed: Jun. 6, 2022

(65) Prior Publication Data
US 2022/0393034 A1 Dec. 8, 2022

(30) Foreign Application Priority Data
Jun. 7, 2021 (CN) .......................... 202110634337.8

(51) Int. Cl.
*H01L 29/786* (2006.01)
*H01L 21/28* (2025.01)
(Continued)

(52) U.S. Cl.
CPC ... *H10D 30/6728* (2025.01); *H01L 21/28088* (2013.01); *H10D 30/031* (2025.01);
(Continued)

(58) Field of Classification Search
CPC .......... H10D 30/6728; H10D 30/6739; H10D 30/6757; H10D 30/031; H10D 30/6713;
(Continued)

(56) References Cited

U.S. PATENT DOCUMENTS 10,777,469 B2 * 9/2020 Bao ................... H01L 21/76229
2018/0090504 A1 * 3/2018 Balakrishnan ....... H10D 84/038
(Continued)

FOREIGN PATENT DOCUMENTS

| CN | 111106160 A | 5/2020 |
| CN | 111106177 A | 5/2020 |
| CN | 113257918 A | 8/2021 |

OTHER PUBLICATIONS

Office Action issued in Chinese Application No. 202110634337.8 mailed on Dec. 30, 2023 (10 pages).

*Primary Examiner* — Peniel M Gumedzoe
(74) *Attorney, Agent, or Firm* — Osha Bergman Watanabe & Burton LLP

(57) ABSTRACT

A semiconductor device and a method of manufacturing the same, and an electronic apparatus including the semiconductor device are provided. The semiconductor device includes: an active region, on a substrate, extending substantially in a vertical direction; a gate stack formed around at least a part of a periphery of the active region, the active region including a channel region opposite to the gate stack, and a first source/drain region and a second source/drain region, and the gate stack including a gate dielectric layer, a work function tuning layer and a gate electrode material layer, and the work function tuning layer being between the gate electrode material layer and the channel region; and a first low-k dielectric layer extending from a first end of the work function tuning layer to surround a first corner of an end portion, on a side facing the channel region, of the gate electrode material layer.

26 Claims, 13 Drawing Sheets

(51) Int. Cl.
  *H01L 29/49* (2006.01)
  *H01L 29/66* (2006.01)
  *H10D 30/01* (2025.01)
  *H10D 30/67* (2025.01)

(52) U.S. Cl.
  CPC ..... *H10D 30/6713* (2025.01); *H10D 30/6739* (2025.01); *H10D 30/6757* (2025.01)

(58) Field of Classification Search
  CPC .......... H01L 29/78642; H01L 29/4908; H01L 29/78618; H01L 29/78696; H01L 29/66742
  See application file for complete search history.

(56) References Cited

U.S. PATENT DOCUMENTS

| | | | |
|---|---|---|---|
| 2018/0097106 A1* | 4/2018 | Zhu | H10D 84/0195 |
| 2021/0175285 A1* | 6/2021 | Reznicek | H10N 70/8833 |
| 2021/0175344 A1* | 6/2021 | Zhu | H01L 21/2254 |

* cited by examiner

SEMICONDUCTOR DEVICE AND METHOD OF MANUFACTURING THE SAME, AND ELECTRONIC APPARATUS INCLUDING SEMICONDUCTOR DEVICE

CROSS REFERENCE TO RELATED APPLICATION(S)

This application claims priority to Chinese Patent Application No. 202110634337.8, filed on Jun. 7, 2021, the entire contents of which are incorporated herein in their entireties by reference.

TECHNICAL FIELD

The present disclosure relates to a field of semiconductor, and in particular to a vertical semiconductor device, a method of manufacturing the semiconductor device, and an electronic apparatus including the semiconductor device.

BACKGROUND

In a horizontal device such as a metal oxide semiconductor field effect transistor (MOSFET), a source, a gate and a drain are arranged in a direction substantially parallel to a surface of a substrate. Due to such arrangement, it is difficult to further downsize the horizontal device. In contrast, in a vertical device, the source, the gate and the drain are arranged in a direction substantially perpendicular to the surface of the substrate. Therefore, the vertical device may be easier downsized than the horizontal device.

In addition, it is desirable to reduce Gate Induced Drain Leakage (GIDL) in the device.

SUMMARY

The present disclosure at least partially provides a vertical semiconductor device, a method of manufacturing the semiconductor device, and an electronic apparatus including the semiconductor device.

According to an aspect of the present disclosure, a semiconductor device is provided, including: an active region, on a substrate, extending substantially in a vertical direction; a gate stack formed around at least a part of a periphery of a middle section, in the vertical direction, of the active region, wherein the active region includes: a channel region opposite to the gate stack, and a first source/drain region and a second source/drain region respectively on opposite sides of the channel region in the vertical direction, and wherein the gate stack includes: a gate dielectric layer, a work function tuning layer and a gate electrode material layer, and the work function tuning layer is between the gate electrode material layer and the channel region; and a first low-k dielectric layer extending from a first end of the work function tuning layer to surround a first corner of an end portion, on a side facing the channel region, of the gate electrode material layer.

According to another aspect of the present disclosure, a method of manufacturing the semiconductor device is provided, including: disposing, on a substrate, an active region extending substantially in a vertical direction; laterally recessing a middle section, in the vertical direction, of the active region with respect to a lower section of the active region and an upper section of the active region in the vertical direction; forming a gate dielectric layer and a work function tuning layer along a surface of a recess formed by the middle section of the active region with respect to the lower section and the upper section; forming a first position maintaining layer in the recess in which the gate dielectric layer and the work function tuning layer are formed; selectively etching the work function tuning layer by using the first position maintaining layer as a mask, and removing a part of the work function tuning layer in the recess, so as to form a gap in the recess, wherein the gap exposes at least one corner, facing an end portion of the active region, of the first position maintaining layer; forming a low-k dielectric layer along a surface of the active region, wherein the low-k dielectric layer fills the gap and adjoins the work function tuning layer; removing the first position maintaining layer to release a space in the recess; and forming a gate electrode material layer, wherein the gate electrode material layer fills the space.

According to another aspect of the present disclosure, an electronic apparatus is provided, including an integrated circuit formed by the semiconductor device described above.

BRIEF DESCRIPTION OF THE DRAWINGS

The above and other objects, features and advantages of the present disclosure will become more apparent through the following description of embodiments of the present disclosure with reference to the accompanying drawings, in which.

Throughout the accompanying drawings, the same or similar reference signs refer to the same or similar parts.

DETAILED DESCRIPTION OF EMBODIMENTS

Figure 1:
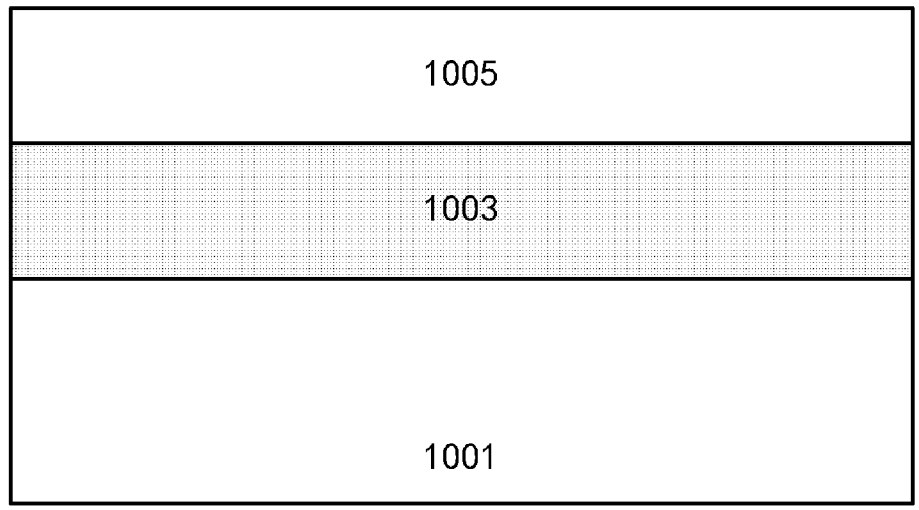
FIG. 1 to FIG. 13 show schematic diagrams of some stages in a process of manufacturing a semiconductor device according to an embodiment of the present disclosure.
Figure 2:
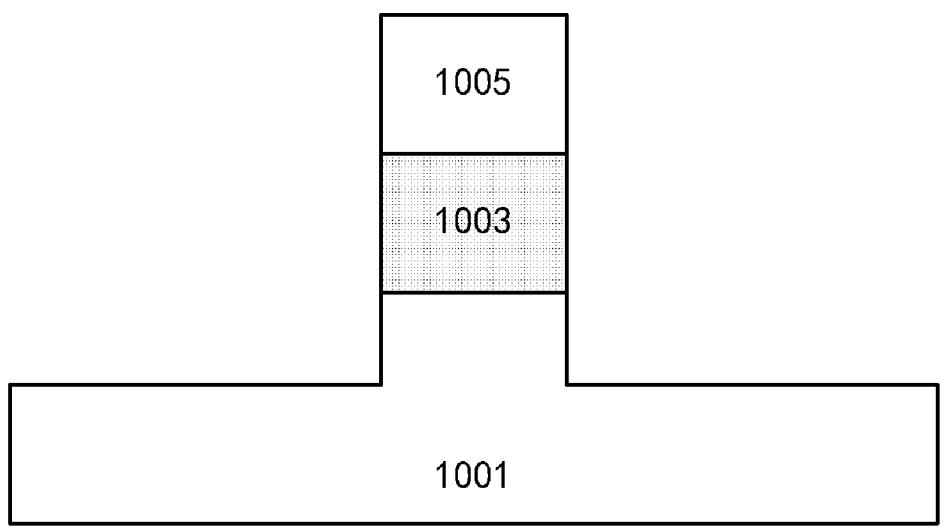
Figure 2:
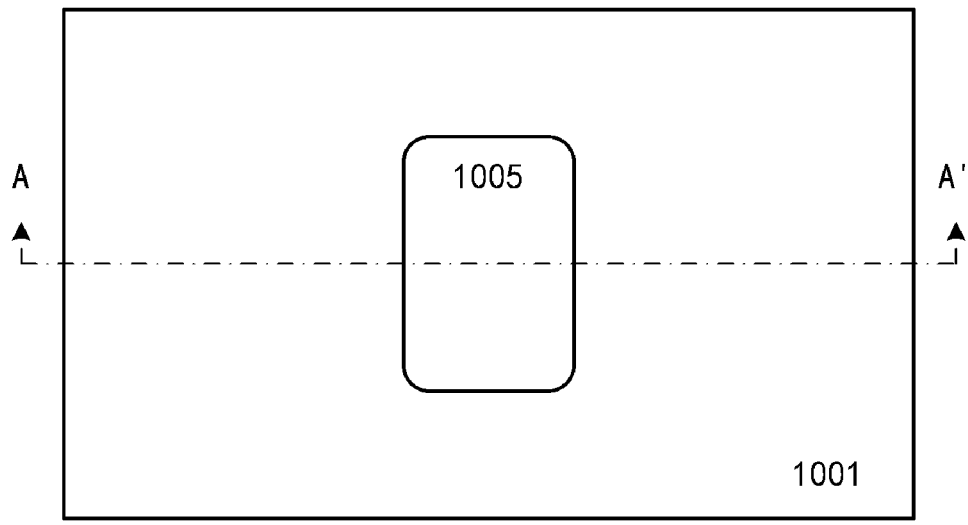

Hereinafter, the embodiments of the present disclosure will be described with reference to the accompanying drawings. It should be understood that these descriptions are merely exemplary and are not intended to limit the scope of the present disclosure. Also, in the following description, descriptions of well-known structures and techniques are omitted to avoid unnecessarily obscuring the concepts of the present disclosure.

Various schematic structural diagrams according to the embodiments of the present disclosure are shown in the accompanying drawings. The figures are not drawn to scale. Some details are enlarged and some details may be omitted for clarity of presentation. The shapes of the various regions and layers as well as the relative size and positional relationship thereof shown in the figures are only exemplary. In practice, there may be deviations due to manufacturing tolerances or technical limitations, and those skilled in the art may additionally design regions/layers with different shapes, sizes and relative positions according to actual desires.

In the context of the present disclosure, when a layer/element is referred to as being located "on" another layer/element, the layer/element may be located directly on the another layer/element, or there may be an intermediate layer/element between them. In addition, if a layer/element is located "on" another layer/element in one orientation, the layer/element may be located "under" the another layer/element when the orientation is reversed.

The embodiments of the present disclosure relate to a vertical semiconductor device. The "vertical" semiconductor device means that its active region (especially a channel region) extends in a vertical direction (e.g. a direction perpendicular or substantially perpendicular to a surface of a substrate) relative to the substrate. The active region may include a single crystal semiconductor material to improve a device performance. A gate stack may be formed around (at least a part of) a periphery of a middle section, in the vertical direction, of the active region. The channel region, opposite to the gate stack, may be formed in the active region, especially in the middle section of the active region. Source/drain regions may be formed in opposite ends of the active region (i.e. an upper section and a lower section on opposite sides of the middle section), and the source/drain regions may be electrically connected with each other through the channel region. For example, the gate stack may include a gate dielectric layer, a work function tuning layer, and a gate electrode material layer.

The work function tuning layer extends between the gate dielectric layer and the gate electrode material layer. According to the embodiments of the present disclosure, for an end portion, on a side facing the channel region, of the gate electrode material layer, the work function tuning layer at the at least one corner of the gate electrode material layer (considering the convenience of the manufacturing process, such as a corner of an upper part of the gate electrode material layer) is removed, and replaced by a low-k dielectric layer to reduce the Gate Induced Drain Leakage (GIDL). That is, for the end portion, on the side facing the channel region, of the gate electrode material layer, at least one corner of the gate electrode material layer (e.g. the corner of the upper part of the gate electrode material layer) may be surrounded by the low-k dielectric layer. The low-k dielectric layer may be disposed only on a drain side (e.g. the upper part of the gate electrode material layer), so as to obtain an asymmetric structure, and thus both effective GIDL suppression and large on-state current may be achieved.

Such low-k dielectric layer may extend to form a gate spacer (a structure that electrically isolate the source/drain region and the gate from each other), or may only extend locally around a corresponding corner. An additional spacer may be disposed in a case of the local extension. The spacer may increase an interval or a distance of an electrical isolation between a conductor layer in the gate stack and the source/drain region, thereby reducing a parasitic capacitance, especially when a thickness of the conductor layer in the gate stack increases in order to reduce a resistance. If the thickness of the conductor layer is large, an overlap between the conductor layer and the source/drain region may increase, which causes the increase of the parasitic capacitance, and thus the spacer may be provided to suppress the increase of the parasitic capacitance.

An end portion of the channel region may be defined by a doping concentration interface between the channel region and the source/drain region. For example, if a change of a doping concentration in a predetermined range (e.g. 10 nm) in a certain direction (e.g. the vertical direction) exceeds a certain threshold value (e.g. the order of change in a range of 10 times to 1000 times), the predetermined range may be called the doping concentration interface in such direction. Those skilled in the art can set such "predetermined range" and "threshold value" according to an actual process condition. Moreover, such doping concentration interface is detectable. For example, the doping concentration may be detected along such direction to obtain the change of the doping concentration in such direction, and the most drastic change of the doping concentration per unit length in such direction may be regarded as the doping concentration interface. In the following embodiments in which the active region is formed by stacking a source/drain layer and a channel layer, the end portion of the channel region may also correspond to the end portion of the channel layer, although they may not be identical.

As described below, such low-k dielectric layer and spacer may be formed in a self-aligned manner. Specifically, the low-k dielectric layer and the spacer may be self-aligned to an upper end of the channel region and/or a lower end of the channel region. Here, the so-called "self-aligned" does not necessarily mean a "completely aligned". The "self-aligned" refers to a relative position between structures is substantially unaffected by a process fluctuation, especially a lithography fluctuation. Such self-aligned structure is detectable. For example, there may be multiple such devices in an integrated circuit (IC), and if it is the self-aligned structure, a positional relationship of the low-k dielectric layer and the spacer relative to the end portion of the channel region in each device may remain substantially unchanged; and if it is not the self-aligned structure, such relative positional relationship may have the process fluctuation between the devices.

The low-k dielectric layer may include a lateral extension portion and a vertical extension portion, and an angle formed by the two portions surrounds a corresponding corner. Here, the "self-aligned" may mean that the lateral extension portion of the low-k dielectric layer or the vertical extension portion of the low-k dielectric layer is self-aligned to a corresponding end portion of the channel region. The vertical extension portion of the low-k dielectric layer may adjoin the work function tuning layer. In addition, the low-k dielectric layer may further include an additional vertical extension portion, and an angle formed by the additional vertical extension portion and the lateral extension portion may surround a corner portion, opposite to the gate stack, of the active region.

According to the embodiments of the present disclosure, the end portion, on the side facing the channel region, of the gate electrode material layer may include a first surface at an upper part of the end portion, a second surface at a lower part of the end portion, and a third surface facing the channel region. The work function tuning layer may extend on the third surface. The low-k dielectric layer may extend from the first surface of the gate electrode material layer and/or the second surface of the gate electrode material layer to the third surface to adjoin the work function tuning layer.

According to the embodiments of the present disclosure, the middle section of the active region may be laterally recessed with respect to a lower section of the active region and an upper section of the active region, which facilitates a self-alignment process. In this case, the work function tuning layer may be disposed in a recess formed by the middle section of the active region with respect to the lower section of the active region and the upper section of the active region, and the end portion, on the side facing the channel region, of the gate electrode material layer may be embedded in the recess.

According to the embodiments of the present disclosure, the active region may be formed by a first source/drain layer (the above-mentioned "lower section"), a channel layer (the above-mentioned "middle section"), and a second source/drain layer (the above-mentioned "upper section"), which are stacked in sequence. The first source/drain layer, the channel layer and the second source/drain layer may be adjacent to each other, and other semiconductor layers such as a leakage suppression layer and an on-state current enhancement layer (a semiconductor layer with a larger or smaller band gap than an adjacent layer) may also exist between the first source/drain layer, the channel layer and the second source/drain layer. The source/drain regions may be substantially formed in the first source/drain layer and the second source/drain layer, and the channel region may be substantially formed in the channel layer. The gate stack may be self-aligned to the channel layer. A gate length may be determined by a thickness of the channel layer itself. The channel layer may be formed, for example, by epitaxial growth, so that its thickness may be well controlled. Therefore, the gate length may be well controlled.

For example, the first source/drain layer may be the substrate of the semiconductor. In this case, the channel layer may be a semiconductor layer epitaxially grown on the substrate, and the second source/drain layer may be a semiconductor layer epitaxially grown on the channel layer. Alternatively, the first source/drain layer may be a semiconductor layer epitaxially grown on the substrate. In this case, the channel layer may be a semiconductor layer epitaxially grown on the first source/drain layer, and the second source/drain layer may be a semiconductor layer epitaxially grown on the channel layer. The separately grown semiconductor layers may have a crystal interface therebetween. In order to easily achieve a relative recess of the middle section, the channel layer may have etching selectivity with respect to the first source/drain layer and the second source/drain layer.

Such semiconductor device may be manufactured, for example, as follows.

A vertical active region may be disposed on the substrate, with the middle section of the active region being relatively recessed. The gate dielectric layer and the work function tuning layer may be formed along a surface of the active region in a substantially conformal manner, and then a first position maintaining layer may be formed in the recess. The work function tuning layer may be selectively etched by using the first position maintaining layer as a mask to partially remove the work function tuning layer, thereby forming a gap in the recess. The work function tuning layer at at least one corner of an end portion, on a side facing the active region, of the first position maintaining layer may be removed. Afterwards, the low-k dielectric layer may be formed. The low-k dielectric layer may fill the above-mentioned gap and adjoin the work function material layer. For example, the low-k dielectric layer may be formed by a spacer forming process.

The low-k dielectric layer may be further selectively etched to release a part of the gap. A spacer of other materials may be formed by, for example, the spacer forming process. The spacer may fill the released part of the gap and adjoin the remaining low-k dielectric layer. Here, a dielectric material of the low-k dielectric layer may be different from that of the spacer to optimize the device performance.

Afterwards, the gate stack may be formed through a gate replacing process. For example, the first position maintaining layer may be removed to release a space in the recess. The gate stack may be formed with an end portion of the gate stack embedded in the recess. The low-k dielectric layer thus surrounds at least one corner of the end portion, which occupies the original position the first position maintaining layer, of the gate stack.

The source/drain regions may be formed in the lower section of the active region and the upper section of the active region, which may be achieved by, for example, doping the lower section of the active region and the upper section of the active region. For example, ion implantation, plasma doping, or in-situ doping during the growth of the first source/drain layer and the second source/drain layer may be performed. According to an advantageous embodiment, a second position maintaining layer may be formed in the recess described above, and then a dopant source layer is formed on the surface of the active region, and a dopant in the dopant source layer is driven into the active region by, for example, annealing. The second position maintaining layer may prevent the dopant in the dopant source layer from directly entering the middle section of the active region (the channel region). However, a part of the dopant may enter the upper end of the middle section and the lower end of the middle section through the upper section of the active region and the lower section of the active region, respectively, which helps reduce a resistance between the source/drain region and the channel region when the device is turned on, thereby improving the device performance.

The present disclosure may be presented in various forms, some examples of which will be described below.

FIG. 1 to FIG. 13 show schematic diagrams of some stages in a process of manufacturing a semiconductor device according to an embodiment of the present disclosure.

As shown in FIG. 1, a substrate 1001 is provided. The substrate 1001 may be various forms of substrates, including but not limited to a bulk semiconductor material substrate such as a bulk Si substrate, a semiconductor-on-insulator (SOI) substrate, a compound semiconductor substrate such as a SiGe substrate, etc. In the following description, for convenience of explanation, the bulk Si substrate is used as an example.

A channel layer 1003 and another semiconductor layer 1005 may be sequentially formed on the substrate 1001 by, for example, epitaxial growth. The channel layer 1003 may define a location of a channel region, and a thickness of the channel layer 1003 corresponding to a desired gate length may be in a range of, for example, about 10 nm to 100 nm. The semiconductor layer 1005 may define a location of an upper source/drain region, and a thickness of the semiconductor layer 1005 may be in a range of, for example, about 30 nm to 100 nm. The substrate 1001 and the layers grown thereon may be single crystal semiconductor layers, and adjacent layers may have etching selectivity with respect to each other. For example, the channel layer 1003 may include SiGe (an atomic percentage of Ge is in a range of, for example, about 10% to 40%), and the semiconductor layer 1005 may include Si.

Next, the active region of the device may be defined. For example, this may be done as follows. Specifically, as shown in FIG. 2(a) and FIG. 2(b) (FIG. 2(a) is a cross-section view, FIG. 2(b) is a top view, wherein a line AA' shows a cut-off position of the cross-section), a photoresist may be formed on a stack of the substrate 1001, the channel layer 1003 and the semiconductor layer 1005 shown in FIG. 1; the photoresist is patterned into a desired shape (which is a rectangle with rounded corners in this example, where a short side of the rectangle is in a range of, for example, about 10 nm to 30 nm) by photolithography (exposure and development); and the semiconductor layer 1005, the channel layer 1003 and the substrate 1001 are selectively etched, for example, reactive ion etched (RIE), sequentially by using the patterned photoresist as the mask. The etching proceeds into the substrate 1001, but not to a bottom surface of the substrate 1001. Thus, the semiconductor layer 1005, the channel layer 1003 and an upper part of the substrate 1001 are formed as a columnar shape after etching. The RIE may be performed, for example, in a direction approximately perpendicular to the surface of the substrate, so that the columnar shape is also approximately perpendicular to the surface of the substrate. Afterwards, the photoresist may be removed.

In this way, the active region of the semiconductor device (the etched channel layer 1003, the semiconductor layer 1005 and the upper part of substrate 1001) is defined. In this example, the active region has an approximately columnar shape. Note that a shape of the active region may change due to a subsequent process, but still be a vertical columnar shape in general.

The shape of the active region is not limited thereto, and other shapes may be formed according to a design layout. For example, in the top view, the active region may be circular (e.g. with a diameter in a range of about 10 nm to 30 nm), square (e.g. with a side length in a range of about 10 nm to 30 nm), etc., or polygonal in order to optimize the device performance such as mobility, etc.

Figure 3:
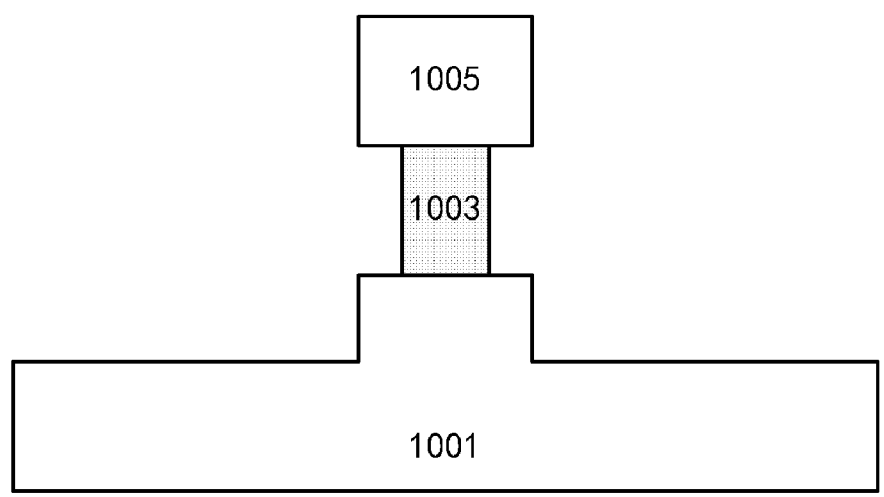

To facilitate the self-alignment process, as shown in FIG. 3, a periphery of the channel layer 1003 may be recessed relative to a periphery of the substrate 1001 and a periphery of the semiconductor layer 1005 (in this example, the periphery of the channel layer 1003 is recessed in the lateral direction generally parallel to the surface of the substrate). For example, this may be achieved by further selectively etching the channel layer 1003 with respect to the substrate 1001 and the semiconductor layer 1005. The formed recess may be self-aligned to the channel layer 1003. Atomic layer etching (ALE) may be used to better control an etching depth. According to the example, the channel layer 1003 (here, SiGe) may be modified by using hydrogen (H) and/or helium (He), and then the modified layer may be removed by wet etching or NH3, NF3 and other groups. This process may be repeated until a desired etching depth is achieved.

Alternatively, digital etching may also be used. For example, a surface of the substrate 1001, a surface of the channel layer 1003 and a surface of the semiconductor layer 1005 are oxidized by, for example, heat treatment, and then their respective surface oxide layers are removed. In a case that the channel layer 1003 includes SiGe and the substrate 1001 and the semiconductor layer 1005 include Si, an oxidation rate of SiGe is higher than that of Si, and an oxide on SiGe is easier to remove. A step of the oxidation-removal of the oxide may be repeated to achieve the desired etch depth.

Figure 4:
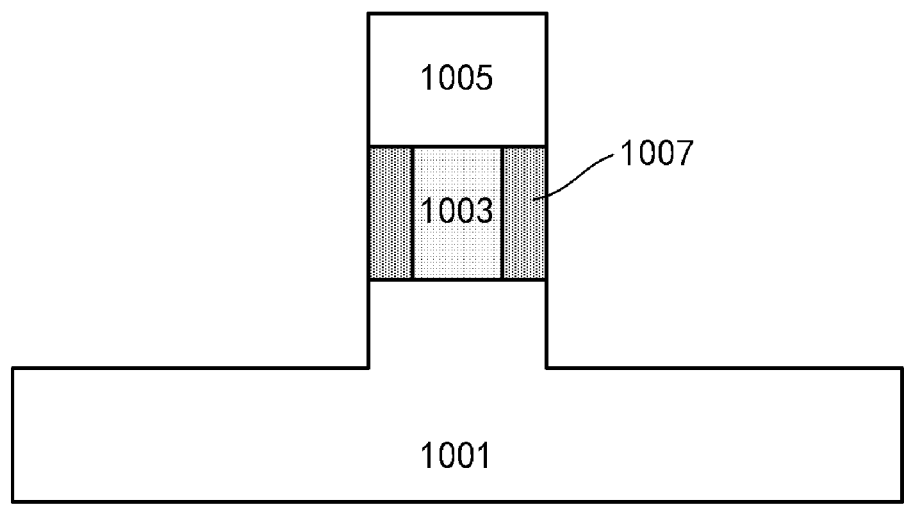

The gate stack will be subsequently formed in the recess formed by the channel layer 1003 with respect to the upper part of the substrate 1001 and the periphery of the semiconductor layer 1005. In order to prevent a subsequent process from affecting the channel layer 1003 or leaving unnecessary material in the recess to affect the subsequent formation of the gate stack, a material layer may be filled in the recess to occupy a space of the gate stack (thus, the material layer may be referred to as a "position maintaining layer" or a "sacrificial gate"). For example, this may be done by depositing a nitride (e.g. silicon nitride) on a structure shown in FIG. 3, and then etching back such as the RIE on the deposited nitride. The RIE may be performed in the direction approximately perpendicular to the surface of the substrate, so that the nitride may substantially remain only within the recess to form a position maintaining layer 1007, as shown in FIG. 4. In this case, the position maintaining layer 1007 may substantially fill the above-mentioned recess.

Next, the source/drain regions may be formed in the substrate 1001 and the semiconductor layer 1005. This may be achieved by doping the substrate 1001 and the semiconductor layer 1005. For example, this may be done as follows.

Figure 5:
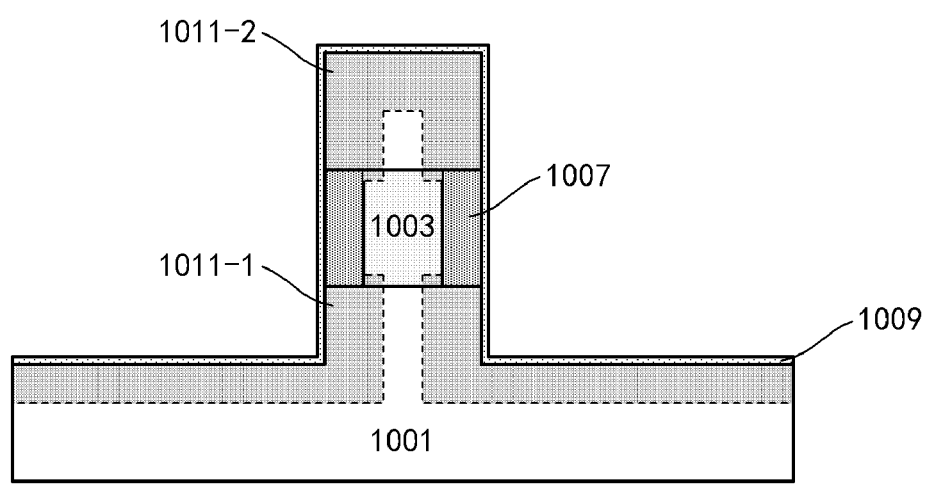

Specifically, as shown in FIG. 5, a dopant source layer 1009 may be formed on a structure shown in FIG. 4. For example, the dopant source layer 1009 may include oxide such as silicon oxide, which contains a dopant. For an n-type device, an n-type dopant may be contained; for a p-type device, a p-type dopant may be contained. The dopant source layer 1009 may be a thin film so as to be substantially conformal deposited on a surface of the structure shown in FIG. 4 by, for example, chemical vapor deposition (CVD) or atomic layer deposition (ALD). Next, the dopant contained in the dopant source layer 1009 may be driven into the active region by, for example, annealing, thereby forming a doped region therein, as shown by a shaded portion in the figure. More specifically, the source/drain region 1011-1 may be formed in the substrate 1001, and the other source/drain region 1011-2 may be formed in the semiconductor layer 1005. Afterwards, the dopant source layer 1009 may be removed.

As shown in FIG. 5, a front face of the doped region is schematically shown in a dashed line, which may define an interface between the source/drain regions and other regions (e.g. the channel region, which may be lightly doped or may not be intentionally doped). For example, in an example, the interface may be defined by a doping concentration in a range of about 5E18 cm-3 to 1E19 cm-3. In the following figures, for the sake of clarity, the source/drain region is no longer shown with a shadow, but only a boundary of the source/drain region is schematically shown with the dashed line.

In addition, although there is the position maintaining layer 1007, the dopant may also enter the channel layer 1003 through the substrate 1001 and the semiconductor layer 1005, so as to form certain doping distributions at an upper end of the channel layer 1003 and a lower end of the channel layer 1003, especially to form certain overlaps with an upper end of the position maintaining layer 1007 and a lower end of the position maintaining layer 1007, respectively. Such doping distributions (which may form an extension region, here also as a part of the source/drain region) may reduce a resistance between the source/drain regions when the device is turned on, thereby improving the device performance. Since the doping is performed substantially equally at the upper end of the channel layer 1003 and the lower end of the channel layer 1003, a degree of the doping distribution into the channel layer 1003 at the upper end of the channel layer 1003 and a degree of the doping distribution into the channel layer 1003 at the lower end of the channel layer 1003 may be substantially the same.

In the above example, the source/drain region is formed by driving the dopant into the active region from the dopant source layer, but the present disclosure is not limited thereto. For example, the source/drain region may be formed by ion implantation, plasma doping (e.g. conformal doping along a surface of the structure in FIG. 4). Alternatively, in the process described above with reference to FIG. 1, a well region may be formed in the substrate 1001, and then the channel layer 1003 may be grown thereon, followed by in situ doping of the semiconductor layer 1005 when growing it on the channel layer 1003. While growing the channel layer 1003, it may also be doped in-situ in order to adjust a threshold voltage (Vt) of the device.

In this example, the dopant source layer 1009 includes a portion extending along a horizontal surface of the substrate 1001 such that the doped region formed in the substrate 1001 extends beyond a periphery of a columnar active region. In this way, it may be easily electrically connected to the source/drain region 1011-1 through the doped region in a subsequent process.

In addition, silicification may also be performed on a surface of the source/drain region to reduce a contact resistance. For example, a metal such as Ni or NiPt (with a Pt content in a range of about 1% to 10%) may be deposited on a structure shown in FIG. 5 (removal of the dopant source layer 1009), annealing is then carried out at a temperature in a range of, for example, about 200° C. to 600° C., which causes the metal to react with a semiconductor element such as Si in the active region to form a silicide (here, Ni Si or NiPtSi) layer. Afterwards, an unreacted residual metal may be removed.

Figure 6:
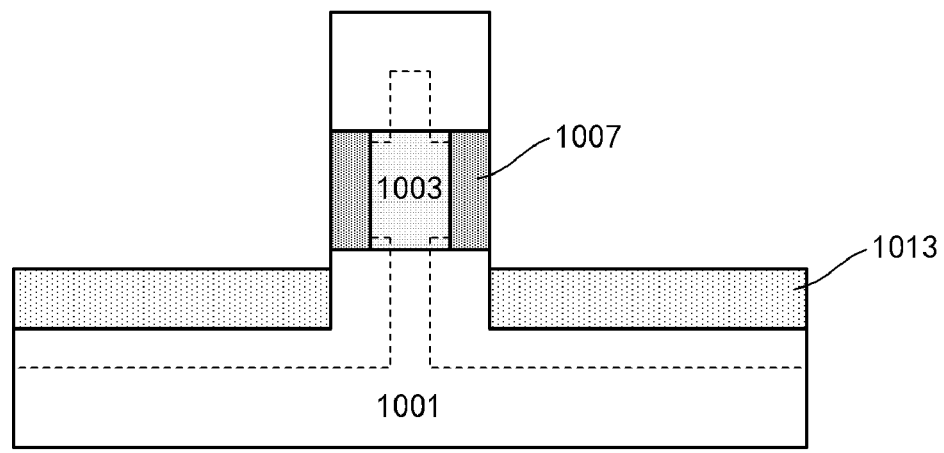

An isolation layer may be formed around the active region to achieve the electrical isolation. For example, as shown in FIG. 6, the oxide (e.g. silicon oxide) may be deposited on the structure shown in FIG. 5 (removal of the dopant source layer 1009) and etched back by, such as RIE, to form an isolation layer 1013. The deposited oxide may be planarized by, such as chemical mechanical polishing (CMP) or sputtering, before the etching back. In an existing process, a top surface of the isolation layer 1013 is usually higher than a top surface of the source/drain region 1011-1 or a bottom surface of the channel layer 1003 in order to reduce an overlap between the gate stack formed on the isolation layer 1013 later and the source/drain region 1011-1. Different from the existing process, according to an embodiment of the present disclosure, the top surface of the isolation layer 1013 may be lower than the top surface of the source/drain region 1011-1 or the bottom surface of the channel layer 1003, which may increase a thickness of a conductor in the gate stack and thus lower the resistance.

When forming the isolation layer, the position maintaining layer 1007 may be reserved to prevent a material of the isolation layer from entering into the above-mentioned recess which is used to accommodate the gate stack. Afterwards, the position maintaining layer 1007 may be removed to release the space of the recess. For example, the position retaining layer 1007 (nitride) may be selectively etched with respect to the isolation layer 1013 (oxide), the semiconductor layer 1005, the substrate 1001 (Si) and the channel layer 1003 (SiGe).

The gate stack may be formed in the released recess. According to an embodiment of the present disclosure, the formation of a GIDL suppression portion may be combined with the formation of the gate stack. The GIDL suppression portion may be implemented as a low-k dielectric such as the oxide around at least one corner of an end portion of the gate stack.

Figure 7:
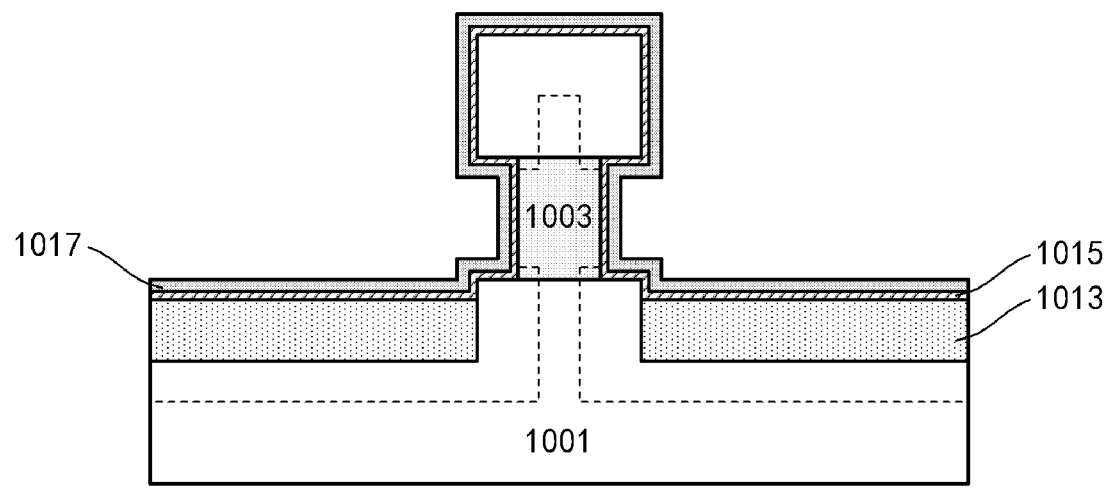

As shown in FIG. 7, a gate dielectric layer 1015 and a work function tuning layer 1017 may be sequentially formed on a structure shown in FIG. 6 (removal of the position maintaining layer 1007) by, for example, deposition. The gate dielectric layer 1015 and the work function tuning layer 1017 may be formed in the substantially conformal manner so as to extend along a surface of the structure. For example, the gate dielectric layer 1015 may include a high-K gate dielectric such as HfO2 with a thickness in a range of about 1 nm to 5 nm; the work function tuning layer 1017 may include (in combination with the gate dielectric layer 1015) a material with an appropriate work function, such as a conductive metal nitride (e.g. TiN, etc.), with a thickness in a range of about 1 nm to 10 nm. In addition, an interface layer with a thickness in a range of about 0.3 nm to 1.5 nm, such as the oxide, may also be formed before forming the gate dielectric layer 1015.

In an existing process, a gate electrode material layer may be directly formed on the work function tuning layer 1017, and thus the gate stack may be formed. In this case, a corner of an end portion of the gate electrode material layer is surrounded by the work function tuning layer 1017. According to an embodiment of the present disclosure, the GIDL suppression portion may be formed. The GIDL suppression portion may be formed at least on a drain side (e.g. an upper side), or may be formed on the drain side as well as a source side. A formation space of the GIDL suppression portion may be defined by using the work function tuning layer 1017 in combination with the position maintaining layer formed in the recess.

Figure 8:
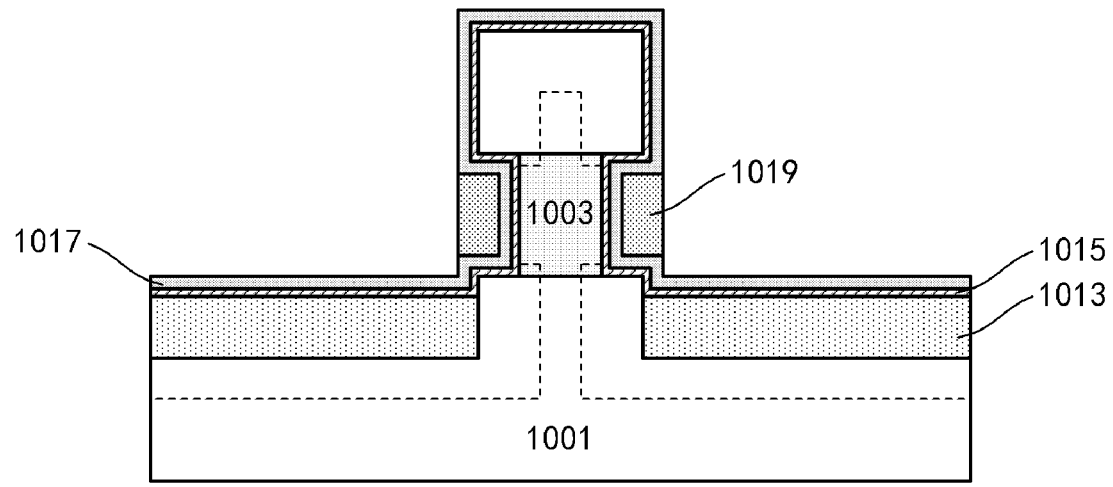
Figure 9:
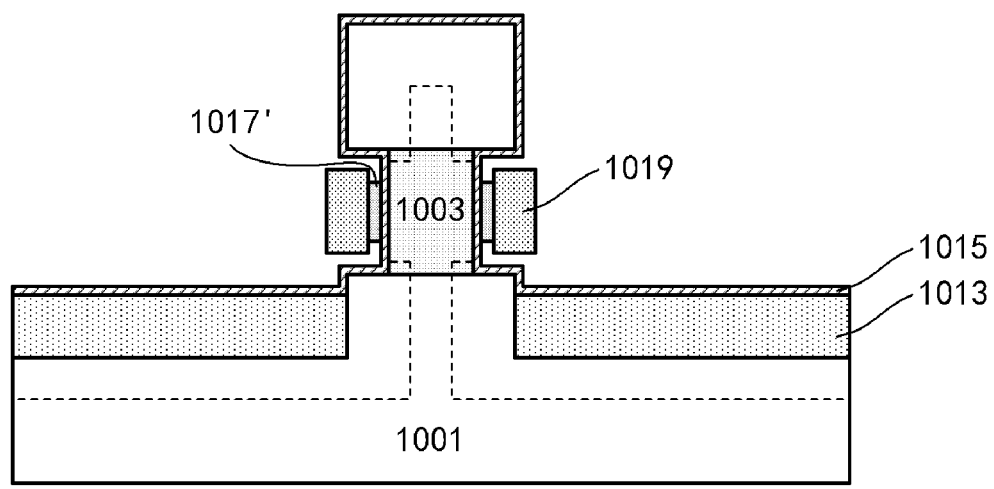

For example, as shown in FIG. 8, another position maintaining layer 1019 may be formed in the recess as described above in combination of FIG. 3 and FIG. 4. In consideration of etching selectivity, the position maintaining layer 1019 may include, for example, SiC. Then, as shown in FIG. 9, the work function tuning layer 1017 may be selectively etched by using the position maintaining layer 1019 as the mask. Here, in order to reduce an electric field generated by a gate in a channel to reduce the GIDL, at least one corner, on a side facing the channel layer 1003, of the position maintaining layer 1019, such as a corner of an upper part, on the side facing the channel layer 1003, of the position maintaining layer 1019, may be exposed (in this embodiment, both the corner of the upper part, on the side facing the channel layer 1003, of the position maintaining layer 1019 and a corner of a lower part, on the side facing the channel layer 1003, of the position maintaining layer 1019 are exposed) for the etching of the work function tuning layer 1017. A remaining work function tuning layer 1017' may extend vertically on a sidewall of the channel layer 1003 without including a corner portion (such corner portion is unfavorable for reducing GIDL). Since the etching performed on an upper side of the work function tuning layer 1017 and the etching performed a lower side of the work function tuning layer 1017 are substantially the same as each other, a top end of the work function tuning layer 1017' and a bottom end of the work function tuning layer 1017' may be recessed to a same degree with respect to an upper surface of the position maintaining layer 1019 and a lower surface of the position maintaining layer 1019, respectively. Here, ALE may be used in order to better control the etching amount.

Figure 10:
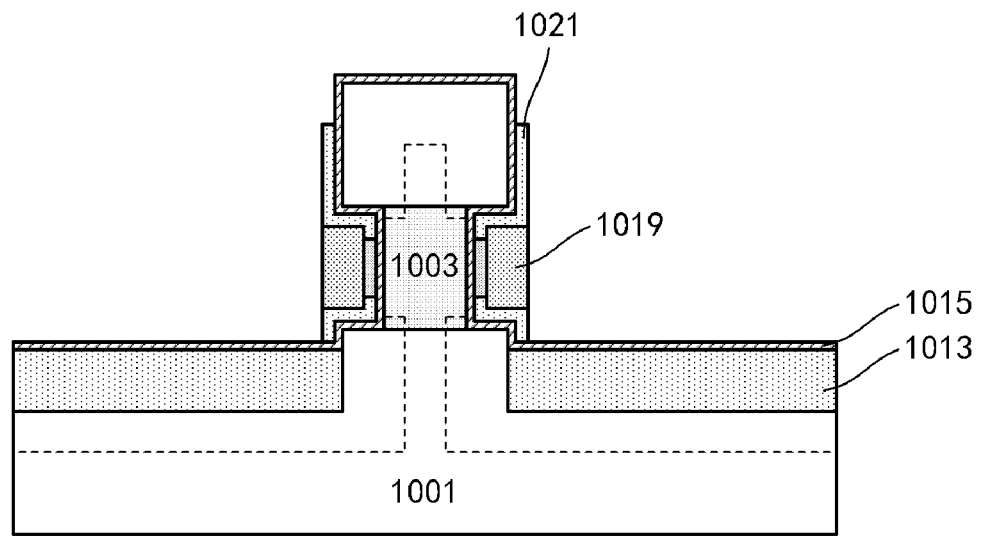

The GIDL suppression portion may be formed in a gap released due to the etching of the work function tuning layer 1017. According to an embodiment, the GIDL suppression portion may be formed in a form of the gate spacer. For example, as shown in FIG. 10, a thin GIDL suppressing material layer may be formed by deposition such as CVD or ALD. The GIDL suppressing material layer may include a low-k dielectric material, such as the nitride or the oxide (so as to have etching selectivity relative to, e.g. the position maintaining layer 1019, the gate dielectric layer 1015, etc.). The GIDL suppressing material layer may be formed in the substantially conformal manner and deposited to a thickness such that the deposited GIDL suppressing material layer may fill a gap between the position maintaining layer 1019 and the active region. The deposited GIDL suppressing material layer may then be subjected to anisotropic etching such as RIE. RIE may be performed in the vertical direction, and an etching amount of the deposited GIDL suppressing material layer may be larger than the deposition thickness, so that a lateral extension portion (not covered by the position maintaining layer 1019) of the GIDL suppressing material layer may be removed, while most of a vertical extension portion of the GIDL suppressing material layer may be retained. In addition, due to the presence of the position maintaining layer 1019, portions, extending on an upper side of the position maintaining layer 1019 and a lower side of the position maintaining layer 1019, of the GIDL suppressing material layer may be retained (although they also extend in the lateral direction). The remaining GIDL suppressing material layer may form a GIDL suppression portion 1021 in the form of the gate spacer.

A portion of the GIDL suppression portion 1021 in the above-mentioned recess occupies a space where the work function tuning layer 1017 is originally located (a thickness of the portion of the GIDL suppression portion 1021 is substantially the same as a thickness of the work function tuning layer 1017'), so it may be self-aligned to the work function tuning layer 1017'. In addition, the work function tuning layer 1017' may be self-aligned to the channel layer 1003 (therefore, the work function tuning layer 1017' is formed in the channel region of the channel layer 1003), so that the portions of the GIDL suppression portion 1021 on the upper side of the position maintaining layer 1019 and the lower side of the position maintaining layer 1019 may also be self-aligned to the upper end of the channel region and the lower end of the channel region.

In this example, the portions of the GIDL suppression portion 1021 on the upper side of the position maintaining layer 1019 and the lower side of the position maintaining layer 1019 also extend upward and downward, respectively, so as to surround a corner in the active region caused by the formation of the recess. This may improve a reliability of the device, e.g., reducing an electrical breakdown and reducing the parasitic capacitance, etc.

Figure 11:
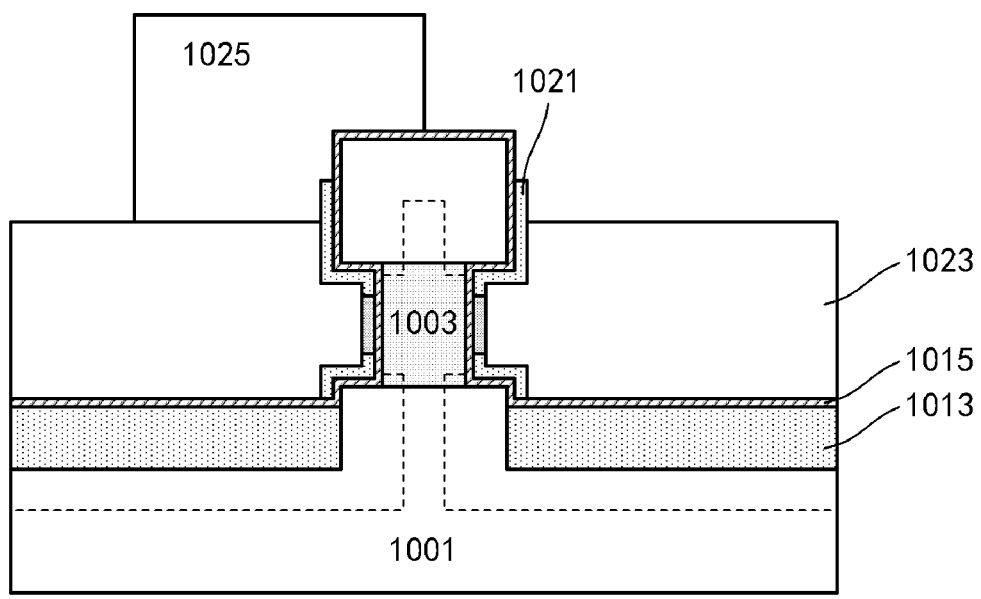

After such formation of the GIDL suppression portion 1021, the position maintaining layer 1019 may be removed, and a gate electrode material layer 1023 may be formed on the isolation layer 1013, as shown in FIG. 11. For example, the gate electrode material layer 1023 may be formed by depositing a conductive material such as the metal and etching back the deposited conductive material. In an existing process, a top surface of the gate electrode material layer 1023 (outside the recess) is usually etched back below a bottom surface of the source/drain region 1011-2 or a top surface of the channel layer 1003 in order to reduce an overlap between the gate stack and the source/drain region 1011-2. In contrast, according to an embodiment of the present disclosure, the top surface of the gate electrode material layer 1023 (outside the recess) may be higher than the bottom surface of the source/drain region 1011-2 or the top surface of the channel layer 1003, which may increase the thickness of the conductor in the gate stack and thus reduce the resistance. While, although there is an overlap between the conductor in the gate stack and the source/drain region, the presence of the GIDL suppression portion 1021 increases a separation between the conductor and the source/drain region, thereby suppressing the increase of the parasitic capacitance.

As shown in FIG. 11, the end portion of the gate stack may be embedded in the recess and self-aligned to the channel layer 1003. In addition, the work function tuning layer 1017' extends on a surface, facing the channel region, of the gate electrode material layer 1023. However, the work function tuning layer 1017' does not extend to surround a corner of the end portion, on a side facing the channel layer, of the gate electrode material layer 1023, while a low-k GIDL suppression portion 1021 extends to surround the corner of the end portion, on the side facing the channel layer, of the gate electrode material layer 1023. As mentioned above, this may reduce GIDL.

Next, a shape of the gate electrode material layer 1023 may be adjusted to facilitate a subsequent interconnection fabrication. For example, a photoresist 1025 may be formed. The photoresist 1025 is patterned, for example, by photolithography, to cover a portion of the gate electrode material layer 1023 outside the recess (in this example, a left half in the figure), and to expose another portion of the gate electrode material layer 1023 outside the recess (in this example, a right half in the figure).

Figure 12:
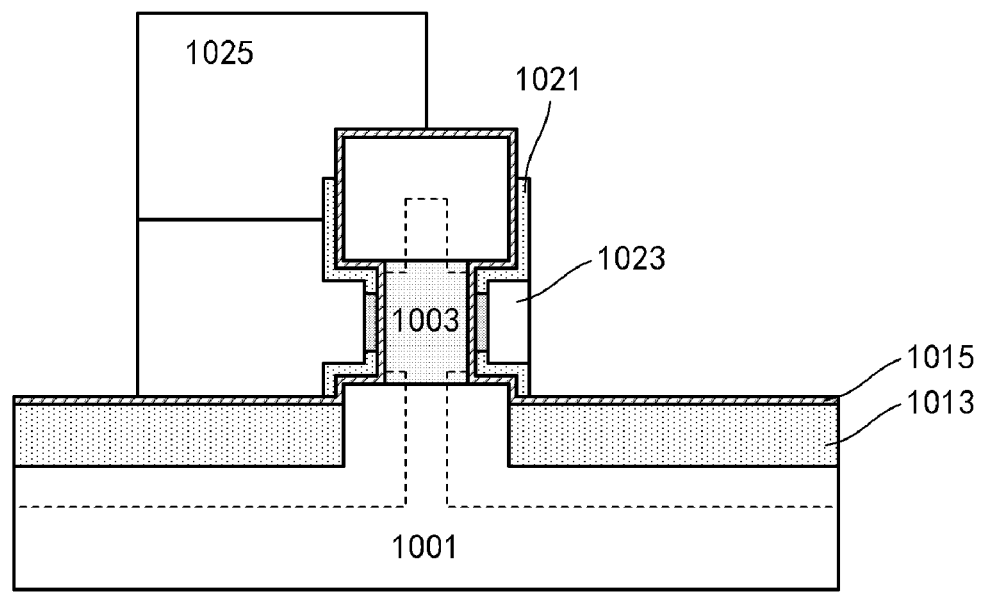

Then, as shown in FIG. 12, the gate electrode material layer 1023 may be selectively etched such as RIE by using the photoresist 1025 as the mask, and RIE may be performed in the vertical direction. In this way, in addition to a portion of the gate electrode material layer 1023 that remains within the recess, a portion of the gate electrode material layer 1023 covered by the photoresist 1025 is retained. Subsequently, an electrical connection to the gate stack may be achieved through the portion of the gate electrode material layer 1023, and thus this portion may also be referred to as a connection portion.

According to another embodiment, the gate dielectric layer 1015 may also be further selectively etched such as RIE. Afterwards, the photoresist 1025 may be removed.

Figure 13:
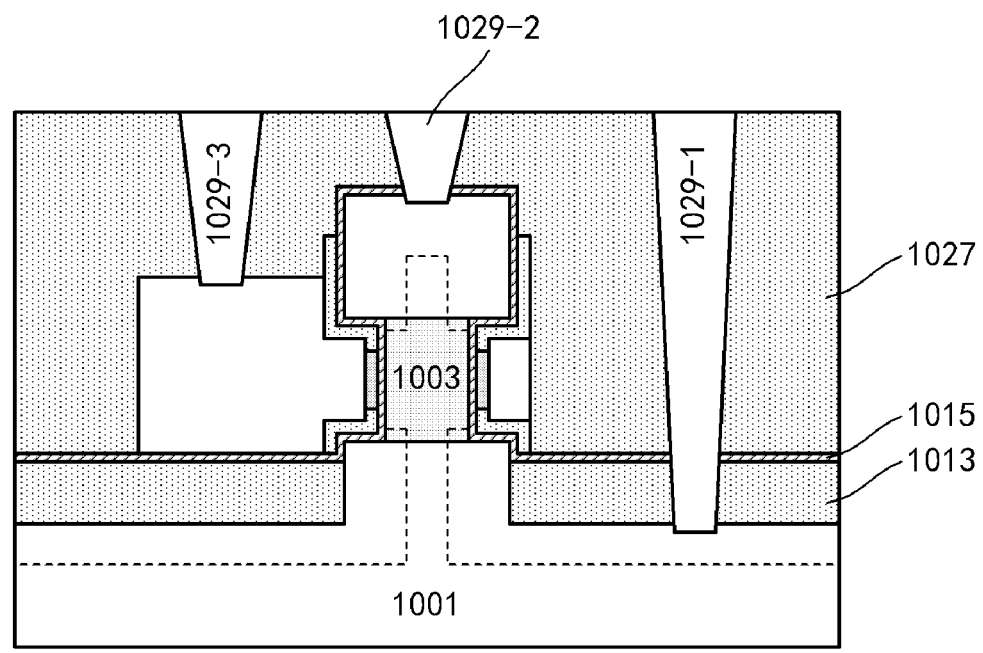

Then, as shown in FIG. 13, an interlayer dielectric layer 1027 may be formed on a structure shown in FIG. 12. For example, the oxide may be deposited and planarized by, such as CMP, to form the interlayer dielectric layer 1027. A contact portion 1029-1 to the source/drain region 1011-1, a contact portion 1029-2 to the source/drain region 1011-2 and a contact portion 1029-3 to the gate electrode material layer 1023 may be formed in the interlayer dielectric layer 1027. These contact portions may be formed by etching holes in the interlayer dielectric layer 1027 and the isolation layer 1013 and filling the holes with the conductive material such as metal.

Since the gate electrode material layer 1023 extends beyond the periphery of the active region, its contact portion 1029-3 may be easily formed. In addition, since the doped region in the substrate 1001 extends beyond the active region and there is no gate conductor layer over at least a portion thereof, its contact portion 1029-1 may be easily formed.

As shown in FIG. 13, the semiconductor device according to this embodiment includes the substrate 1001, the channel layer 1003 and the semiconductor layer 1005 stacked in the vertical direction. The source/drain region 1011-1 is formed in the substrate 1001 and the source/drain region 1011-2 is formed in the semiconductor layer 1005. The channel layer 1003 may be recessed laterally, and the gate stack may be formed around the periphery of the channel layer 1003 and may be embedded in the recess so as to be self-aligned to the channel layer 1003 (and the channel region formed therein). It should be pointed out here that such lateral recess of the channel layer 1003 is not necessarily a final form. For example, as a result of various processes (e.g. the silicification process described above), the upper part of the substrate 1001 and the semiconductor layer 1005 may be thinned so that such lateral recess is small or may not even be present.

The GIDL suppression portion 1021 may be formed on an upper side of the gate electrode material layer 1023 and a lower side of the gate electrode material layer 1023, and may be self-aligned to two ends of the channel layer 1003 or the channel region formed therein. In this example, the GIDL suppression portion 1021 may be aligned to the work function tuning layer 1017 and extend from an end portion of the work function tuning layer 1017. The GIDL suppression portion 1021 extends to surround the corner of the end portion, on the side facing the channel layer, of the gate electrode material layer 1023 to reduce the GIDL. In addition, in this embodiment, the GIDL suppression portion 1021 is formed in the form of the spacer, so that an interval between the gate electrode material layer 1023 and the source/drain region may be increased, thereby suppressing the increase of the parasitic capacitance.

In the above embodiments, the GIDL suppression portion 1021 extends to form the gate spacer, but the present disclosure is not limited thereto.

Figure 14:
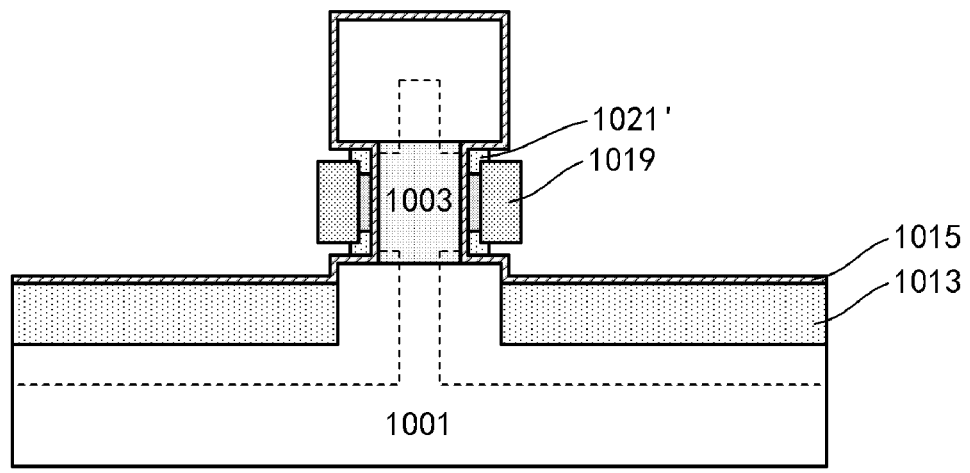
FIG. 14 to FIG. 16 show schematic diagrams of some stages in a process of manufacturing a semiconductor device according to another embodiment of the present disclosure.

For example, as shown in FIG. 14, after forming the GIDL suppression portion 1021 in the form of spacer as described above in combination with FIG. 10, the GIDL suppression portion 1021 may be further etched back by selective etching to release a space of the upper side of the position maintaining layer 1019 and the lower side of the position maintaining layer 1019. An etched back GIDL suppression portion 1021' extends slightly on the upper surface of the position maintaining layer 1019 and the lower surface of the position maintaining layer 1019 in addition to a portion extending on the surface of the channel layer 1003, so as to surround a corner of the position maintaining layer 1019.

Figure 15:
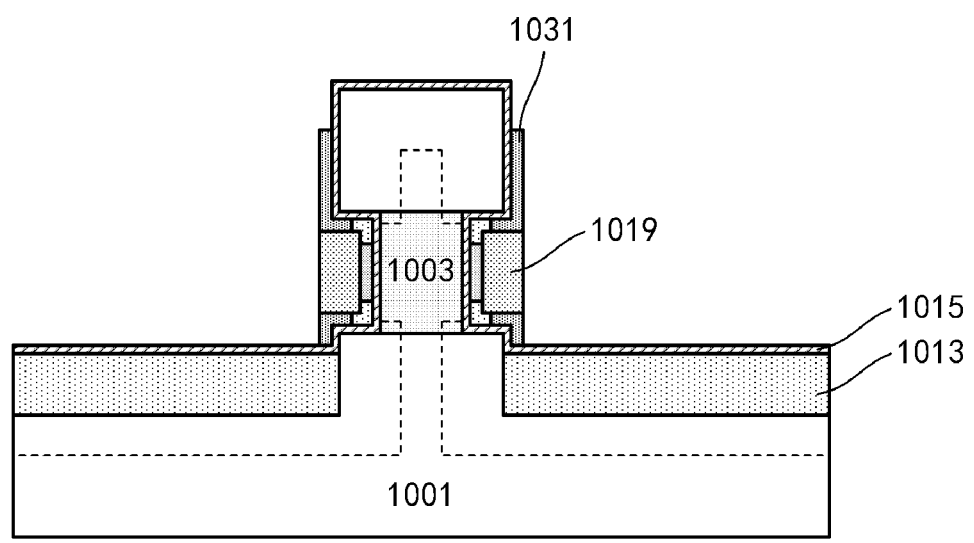

Afterwards, as shown in FIG. 15, a spacer 1031 may be formed according to the spacer forming process described above in combination with FIG. 10. The spacer 1031 may include a dielectric material (e.g. nitride) different from that of the GIDL suppression portion 1021' (e.g. oxide) to optimize the device performance. For example, the nitride is more stable than the oxide and is less susceptible to damage by erosion in the subsequent process.

Figure 16:
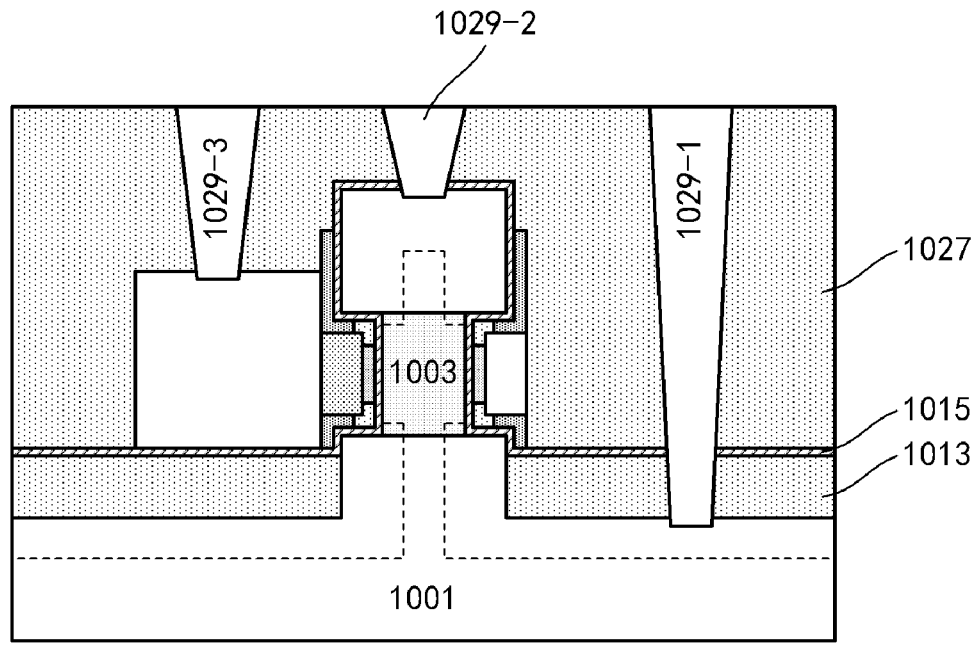

Then, a fabrication of the device may be completed according to the above process, and thus a semiconductor device shown in FIG. 16 is obtained. The semiconductor device is substantially the same as the device described above in combination with FIG. 13, except for the GIDL suppression portion 1021' and the spacer 1031.

In the above embodiment, the GIDL suppression portion 1021 or 1021' surrounds an upper corner of the end portion of the gate electrode material layer 1023 and a lower corner of the end portion of the gate electrode material layer 1023. However, the present disclosure is not limited thereto. The GIDL suppression portion may be formed only at a corner of one side, especially a corner of the drain side.

Figure 17:
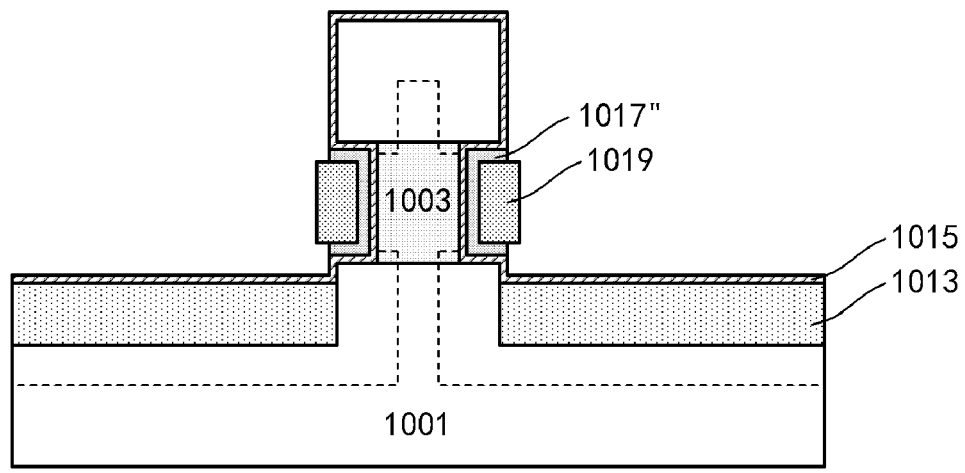
FIG. 17 to FIG. 19 show schematic diagrams of some stages in a process of manufacturing a semiconductor device according to another embodiment of the present disclosure.

For example, as shown in FIG. 17, in the process of etching the work function tuning layer 1017 described above in combination with FIG. 9, the etching amount of the work function tuning layer 1017 may be controlled so that an etched work function tuning layer 1017" does not expose a corner, on the side facing the channel layer 1003, of the position maintaining layer 1019. More specifically, the remaining work function tuning layer 1017" extends on the upper surface of the position maintaining layer 1019 and the lower surface of the position maintaining layer 1019 in addition to a portion extending on the sidewall of the channel layer 1003. In this example, the work function tuning layer 1017" extends on almost entire the upper surface of the position maintaining layer 1019 and the lower surface of the position maintaining layer 1019.

Figure 18:
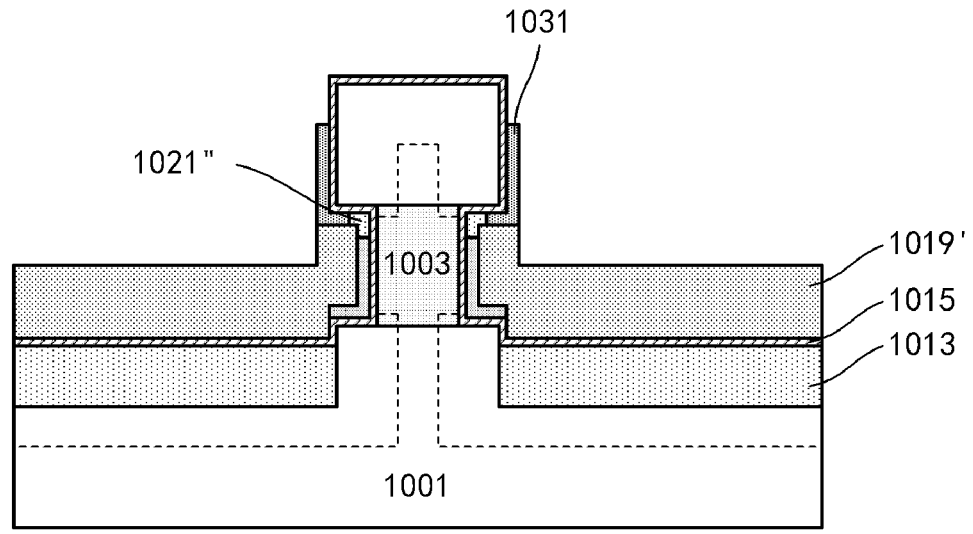

After that, as shown in FIG. 18, a shielding layer may be formed to shield a portion of the work function tuning layer 1017" below the position maintaining layer 1019. Here, the shielding layer may include the same material as the position maintaining layer 1019 (so that the shielding layer and the position maintaining layer 1019 may be subsequently removed together), so the two layers are shown together as 1019' in FIG. 18. A top surface of the shielding layer may be etched back (e.g. below the top surface of the position maintaining layer 1019 to) expose a portion of the work function tuning layer 1017" above the position maintaining layer 1019. The work function tuning layer 1017" may be selectively etched as described above in combination with FIG. 9. Here, the portion of the work function tuning layer 1017" above the position maintaining layer 1019 is exposed by the shielding layer, and thus may be etched so that a corner of an upper part, on the side facing the channel layer 1003, of the position maintaining layer 1019 may be exposed. On the contrary, the portion of the work function tuning layer 1017" below the position maintaining layer 1019 is shielded by the shielding layer and may not be etched.

After that, the GIDL suppression portion 1021" may be formed as described above in the presence of the shielding layer and the position maintaining layer 1019'. In the example of FIG. 18, the GIDL suppression portion 1021" is in the same form as the above-described GIDL suppression portion 1021' (only surround a corner and not formed in the form of the spacer), and thus a gate spacer 1031 may also be formed as described above. The GIDL suppression portion 1021" itself may also be formed in the form of the gate spacer as described above.

Figure 19:
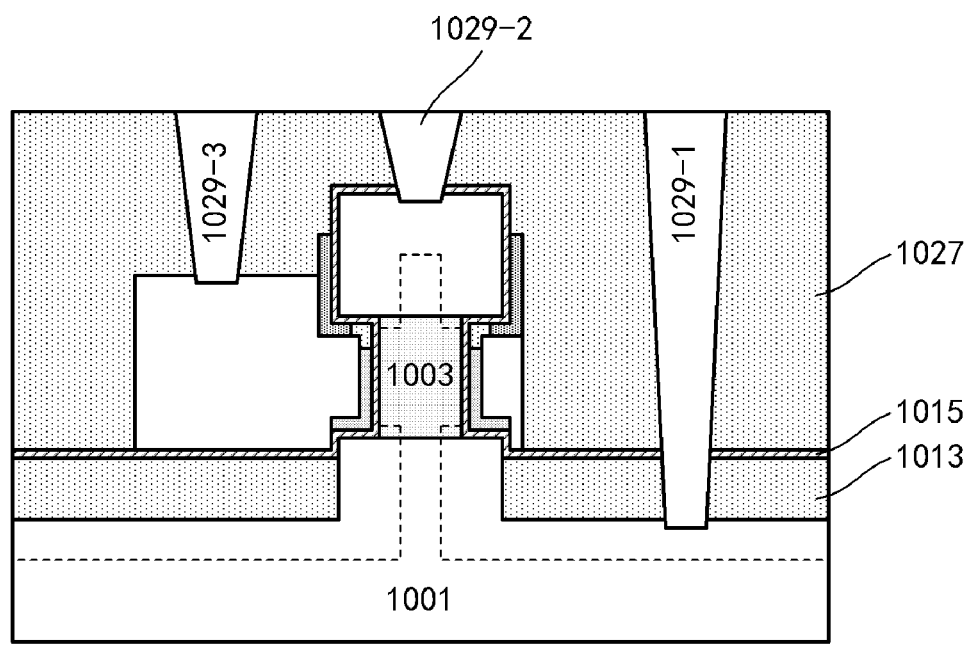

After that, the shielding layer and the position maintaining layer 1019' may be removed, the fabrication of the device may be completed according to the above process, and thus a semiconductor device shown in FIG. 19 may be obtained. The semiconductor device is substantially the same as the device described above in combination with FIG. 16, except that the GIDL suppression portion 1021" only surrounds an upper corner of the end portion of the gate electrode material.

In the above embodiments, the lower source/drain region 1011-1 is formed in the substrate 1001. However, the present disclosure is not limited thereto.

Figure 20:
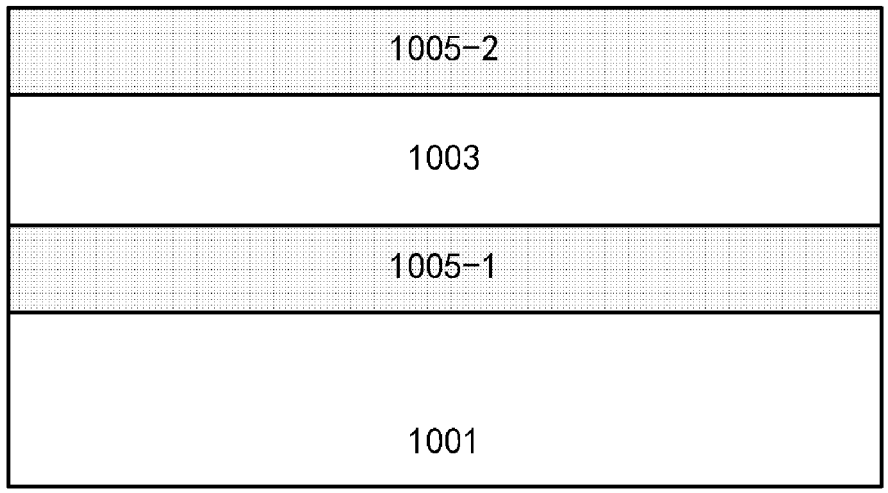
FIG. 20 and FIG. 21 show schematic diagrams of some stages in a process of manufacturing a semiconductor device according to another embodiment of the present disclosure.

For example, as shown in FIG. 20, a first source/drain layer 1005-1, the channel layer 1003 and a second source/drain layer 1005-2 may be sequentially disposed on the substrate by, for example, epitaxial growth. Regarding the channel layer 1003, reference may be made to the description of the channel layer in the above embodiment. In addition, regarding the first source/drain layer 1005-1 and the second source/drain layer 1005-2, reference may be made to the description of the semiconductor layer 1005 in the above embodiment. The difference is that their materials may be different from those in the above embodiments in order to provide etching selectivity between adjacent layers. Additionally, these layers may be doped in situ to provide an appropriate doping distribution when they are grown.

Figure 21:
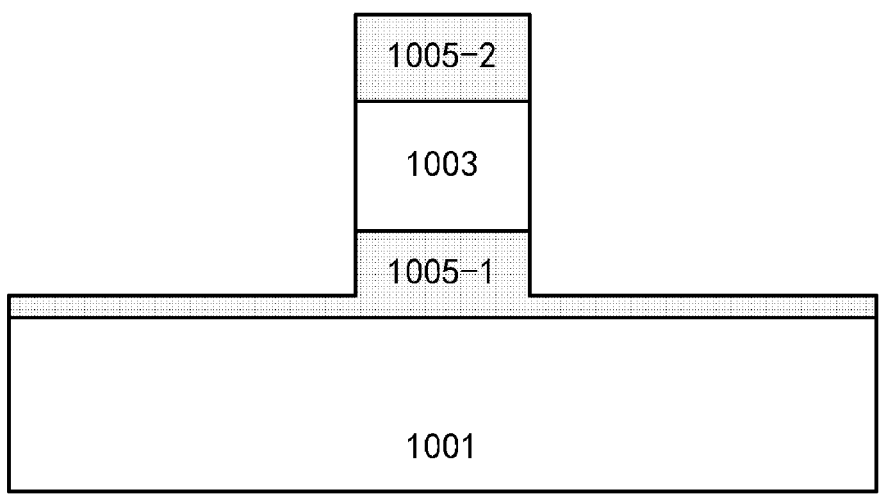

The active region may then be defined as described above in combination with FIG. 2(*a*) and FIG. 2(*b*). Here, etching may proceed into the first source/drain layer 1005-1 as shown in FIG. 21. Afterwards, processing may be performed in the manner of the above embodiments. For example, by selective etching, the channel layer 1003 is laterally recessed with respect to the first source/drain layer 1005-1 and the second source/drain layer 1005-2, and the position maintaining layer is formed in the lateral recess, so as to form a self-aligned GIDL suppression portion and the gate stack. In a case of in-situ doping, a part of the dopant in the first source/drain layer 1005-1 and the second source/drain layer 1005-2 may be driven into two ends of the channel layer 1003 by annealing, so as to form the extension region.

In the above embodiments, the channel layer and the source/drain layer having etching selectivity with respect to each other are respectively disposed to facilitate selective etching so that the channel layer is relatively laterally recessed, but the present disclosure is not limited thereto.

Figure 22:
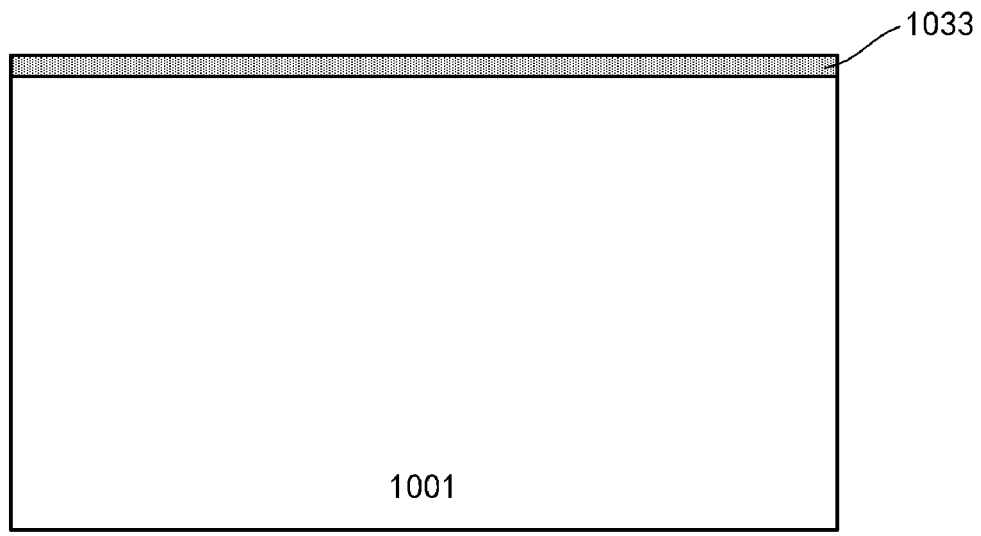
FIG. 22 to FIG. 25 show schematic diagrams of some stages in a process of manufacturing a semiconductor device according to another embodiment of the present disclosure.

For example, as shown in FIG. 22, a bulk substrate 1001 (e.g. a silicon wafer) is provided. A first shielding layer 1033 may be formed on a top surface of the substrate 1001, by, e.g. deposition.

Figure 23:
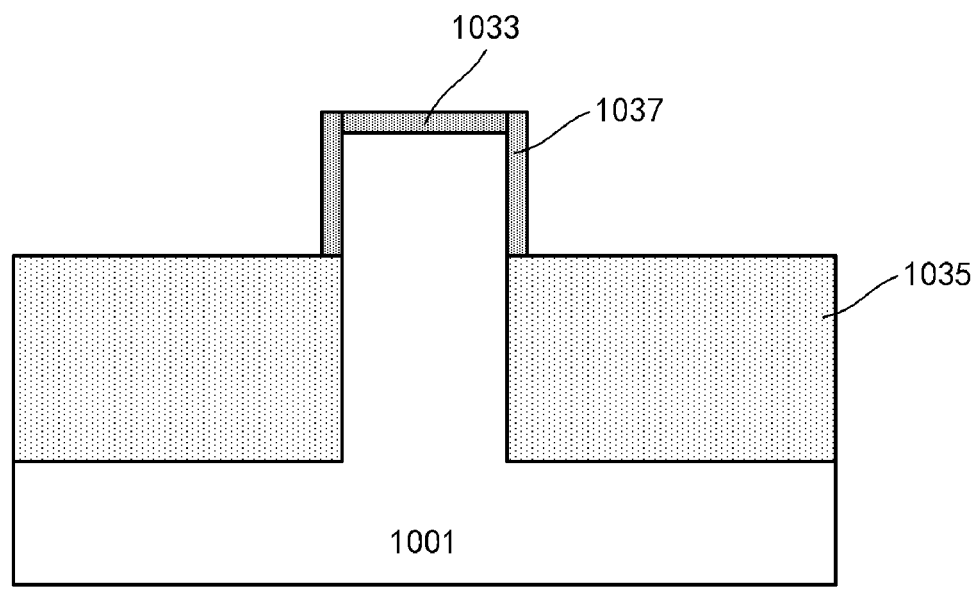
Figure 24:
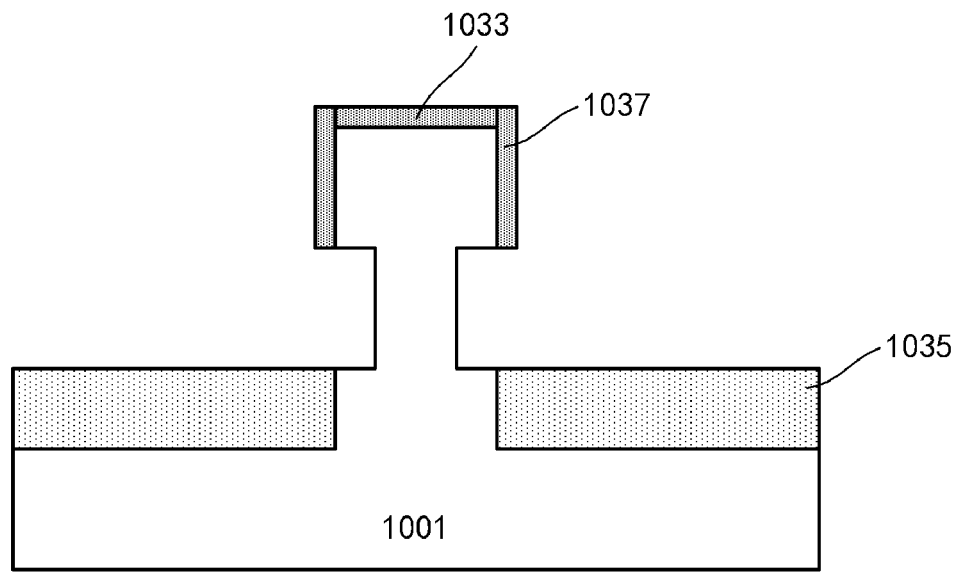

The active region may then be defined as described above in combination with FIG. 2(*a*) and FIG. 2(*b*). As shown in FIG. 23, the active region may be formed in the columnar shape protruding from the substrate 1001. In order to form a lateral recess in a middle part of the columnar active region for forming the self-aligned spacer and the gate stack as described above, an upper part of the active region and a lower part of the active region may be shielded by the shielding layer. For example, as shown in FIG. 23, a second shielding layer 1035 may be formed on the substrate 1001 by depositing and then etching back (which may be planarized before etching back), and a third shielding layer 1037 in the form of the spacer may be formed by the spacer forming process on the second shielding layer 1035. Then, as shown in FIG. 24, a sidewall of the middle part of the active region may be exposed by etching back the second shielding layer 1035. The exposed sidewall of the active region may be relatively recessed by lateral etching as described above. Afterwards, these shielding layers may be removed.

Figure 25:
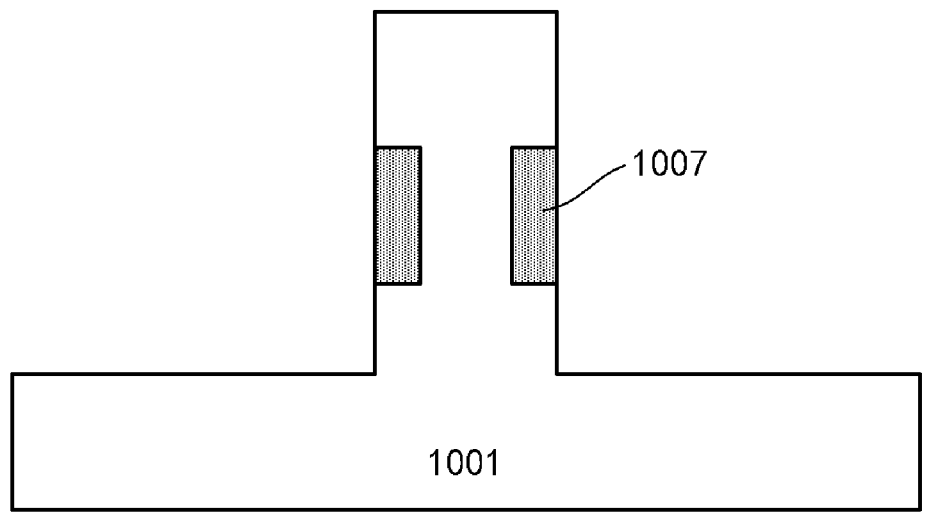

In such formed recess, the position maintaining layer 1007 may be formed as described above, as shown in FIG. 25. Afterwards, the process can proceed as described above.

According to the embodiments of the present disclosure, the semiconductor device may be applied to various electronic apparatuses. For example, an integrated circuit (IC) may be formed by a plurality of such semiconductor devices and other devices (e.g. transistors in other forms), and electronic apparatuses may be constructed therefrom. Accordingly, the present disclosure further provides an electronic apparatus including the semiconductor device described above. The electronic apparatus may also include components such as a display screen cooperating with the IC and a wireless transceiver cooperating with the IC. Such electronic apparatus may be, for example, a smart phone, a personal computer (PC), a tablet computer, an artificial intelligence device, a wearable device, or a mobile power.

According to the embodiments of the present disclosure, a method of fabricating a system-on-chip (SoC) is further provided. The method may include the methods of manufacturing the semiconductor device described above. Specifically, a variety of devices may be integrated on a chip, at least some of which are fabricated according to the methods of the present disclosure.

In the above description, technical details such as patterning and etching of various layers are not described in detail. However, those skilled in the art should understand that various technical means may be used to form layers and regions, etc. of desired shapes. In addition, in order to form the same structure, those skilled in the art can also design methods that are not exactly the same as those described above. Additionally, although the various embodiments are described above separately, this does not mean that the measures in the various embodiments cannot be used in combination advantageously.

The embodiments of the present disclosure have been described above. However, these embodiments are for illustrative purposes only, but not intended to limit the scope of the present disclosure. The scope of the present disclosure is defined by the appended claims and their equivalents. Without departing from the scope of the present disclosure, those skilled in the art can make various substitutions and modifications, and these substitutions and modifications should all fall within the scope of the present disclosure.

What is claimed is:

1. A semiconductor device, comprising:
   an active region, on a substrate, extending substantially in a vertical direction;
   a gate stack formed around at least a part of a periphery of a middle section, in the vertical direction, of the active region,
      wherein the active region comprises: a channel region opposite to the gate stack, and a first source/drain region and a second source/drain region respectively on opposite sides of the channel region in the vertical direction, and
      wherein the gate stack comprises: a gate dielectric layer, a work function tuning layer and a gate electrode material layer, and the work function tuning layer is between the gate electrode material layer and the channel region; and
   a first low-k dielectric layer extending from a first end of the work function tuning layer to surround a first corner of an end portion, on a side facing the channel region, of the gate electrode material layer.

2. The semiconductor device according to claim 1, further comprising:
   a second low-k dielectric layer extending from a second end, opposite to the first end, of the work function tuning layer, to surround a second corner, opposite to the first corner, of the end portion of the gate electrode material layer.

3. The semiconductor device according to claim 2, wherein the first low-k dielectric layer and the second low-k dielectric layer extend to surround a corner portion, opposite to the gate stack, of the active region, respectively.

4. The semiconductor device according to claim 3,
   wherein the first low-k dielectric layer comprises:
      a first portion extending substantially in a lateral direction,
      a second portion extending between the first portion and the first end of the work function tuning layer, and
      a third portion extending from the first portion on a side opposite to the second portion,
         wherein an angle formed by the first portion and the second portion surrounds the first corner of the end portion of the gate electrode material layer, and an angle formed by the first portion and the third portion surrounds the corner portion, opposite to the gate stack, of the active region; and
   wherein the second low-k dielectric layer comprises:
      a first portion extending substantially in a lateral direction, a second portion extending between the first portion and the second end of the work function tuning layer, and a third portion extending from the first portion on a side opposite to the second portion, wherein an angle formed by the first portion and the second portion surrounds the second corner of the end portion of the gate electrode material layer, and an angle formed by the first portion and the third portion surrounds the corner portion, opposite to the gate stack, of the active region.

5. The semiconductor device according to claim 2, wherein the end portion of the gate electrode material layer comprises:

a first surface at an upper part of the end portion, a second surface at a lower part of the end portion, and a third surface facing the channel region, wherein the work function tuning layer extends on the third surface.

6. The semiconductor device according to claim 5, wherein the first low-k dielectric layer extends on the first surface and extends to the third surface to adjoin the first end of the work function tuning layer, and the second low-k dielectric layer extends on the second surface and extends to the third surface to adjoin the second end of the work function tuning layer.

7. The semiconductor device according to claim 6, wherein an extension length of the first low-k dielectric layer on the third surface is substantially equal to an extension length of the second low-k dielectric layer on the third surface.

8. The semiconductor device according to claim 6, wherein a thickness of a portion of the first low-k dielectric layer extending on the first surface, a thickness of a portion of the first low-k dielectric layer extending on the third surface, a thickness of a portion of the second low-k dielectric layer extending on the second surface, and a thickness of a portion of the second low-k dielectric layer extending on the third surface are substantially equal to a thickness of the work function tuning layer.

9. The semiconductor device according to claim 6, wherein a portion of the first low-k dielectric layer extending on the third surface and a portion of the second low-k dielectric layer extending on the third surface are substantially coplanar with the work function tuning layer.

10. The semiconductor device according to claim 2, further comprising:

a first dielectric layer extending from an end portion, on a side opposite to the first end of the work function tuning layer, of the first low-k dielectric layer, to surround a corner portion, opposite to the gate stack, of the active region; and a second dielectric layer extending from an end portion, on a side opposite to the second end of the work function tuning layer, of the second low-k dielectric layer, to surround the corner portion, opposite to the gate stack, of the active region.

11. The semiconductor device according to claim 10, wherein the first low-k dielectric layer and the second low-k dielectric layer comprise a first dielectric material, and the first dielectric layer and the second dielectric layer comprise a second dielectric material different form the first dielectric material.

12. The semiconductor device according to claim 1, wherein the work function tuning layer extends to surround a second corner, opposite to the first corner, of the end portion of the gate electrode material layer.

13. The semiconductor device according to claim 12, wherein the first low-k dielectric layer extends to surround a corner portion, opposite to the gate stack, of the active region.

14. The semiconductor device according to claim 12, further comprising:

a first dielectric layer extending from an end portion, on a side opposite to the first end of the work function tuning layer, of the first low-k dielectric layer, to surround a corner portion, opposite to the gate stack, of the active region, wherein the first dielectric layer comprises a dielectric material different from a dielectric material of the first low-k dielectric layer.

15. The semiconductor device according to claim 1, wherein the gate electrode material layer comprises the end portion and a connection portion away from the channel region with respect to the end portion, and a thickness of the connection portion in a vertical direction is greater than a thickness of the end portion in the vertical direction.

16. The semiconductor device according to claim 15, wherein:

a bottom surface of the connection portion is lower than a bottom surface of the end portion; and/or a top surface of the connection portion is higher than a top surface of the end portion.

17. The semiconductor device according to claim 1, wherein the middle section of the active region is laterally recessed with respect to a lower section of the active region and an upper section of the active region, and the work function tuning layer is disposed in a recess formed by the middle section of the active region with respect to the lower section and the upper section, and the end portion of the gate electrode material layer is embedded into the recess.

18. The semiconductor device according to claim 17, wherein the work function tuning layer extends on a vertical sidewall of the recess, and does not extend to an upper wall of the recess.

19. The semiconductor device according to claim 18, wherein:

the work function tuning layer extends on a lower wall of the recess; or the work function tuning layer does not extend on a lower wall of the recess.

20. The semiconductor device according to claim 17, wherein the first low-k dielectric layer extends beyond the recess from the work function tuning layer.

21. The semiconductor device according to claim 1, wherein the active region comprises: a first source/drain layer, a channel layer, and a second source/drain layer stacked in sequence, and the channel region is formed in the channel layer.

22. The semiconductor device according to claim 21, wherein:

the channel layer and the first source/drain layer have a crystal interface therebetween; and/or the channel layer and the second source/drain layer have a crystal interface therebetween.

23. The semiconductor device according to claim 21, wherein the channel layer has an etch selectivity with respect to the first source/drain layer and the second source/drain layer.

24. The semiconductor device of claim 1, wherein the active region comprises a single crystal semiconductor material.

25. An electronic apparatus, comprising an integrated circuit formed by the semiconductor device according to claim 1.

26. The electronic apparatus according to claim 25, wherein the electronic apparatus comprises a smart phone, a personal computer, a tablet computer, an artificial intelligence device, a wearable device, or a mobile power.

* * * * *